(12) United States Patent
Chan et al.

(10) Patent No.: US 9,637,378 B2
(45) Date of Patent: May 2, 2017

(54) CUP-LIKE GETTER SCHEME

(71) Applicant: Taiwan Semiconductor Manufacturing Co., Ltd., Hsin-Chu (TW)

(72) Inventors: Chih-Jen Chan, Changhua (TW); Lee-Chuan Tseng, New Taipei (TW); Shih-Wei Lin, Taipei (TW); Che-Ming Chang, Longtan Township (TW); Chung-Yen Chou, Hsinchu (TW); Yuan-Chih Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 486 days.

(21) Appl. No.: 14/023,572

(22) Filed: Sep. 11, 2013

(65) Prior Publication Data

US 2015/0069539 A1    Mar. 12, 2015

(51) Int. Cl.
*B81B 7/02* (2006.01)
*B81B 1/00* (2006.01)
*B81C 1/00* (2006.01)
*H01L 23/26* (2006.01)

(52) U.S. Cl.
CPC .......... *B81C 1/00285* (2013.01); *H01L 23/26* (2013.01); *B81B 2201/0235* (2013.01); *B81B 2201/0242* (2013.01); *B81B 2207/015* (2013.01); *B81C 2203/0118* (2013.01); *H01L 2924/0002* (2013.01)

(58) Field of Classification Search
CPC ............... H01L 23/26; B81B 2207/015; B81C 1/00285; B81C 2203/0118

USPC ......................................................... 257/414
See application file for complete search history.

(56) References Cited

U.S. PATENT DOCUMENTS

| 6,074,926 A | 6/2000 | Cathey et al. |
| 7,462,931 B2 | 12/2008 | Summers |
| 7,736,929 B1 | 6/2010 | Monadgemi et al. |
| 7,952,189 B2 * | 5/2011 | Wan ................ B81C 1/00269 257/704 |

(Continued)

OTHER PUBLICATIONS

Notice of Allowance Dated Sep. 14, 2015 U.S. Appl. No. 14/053,751.

(Continued)

*Primary Examiner* — Marcos D Pizarro
(74) *Attorney, Agent, or Firm* — Eschweiler & Potashnik, LLC

(57) ABSTRACT

The present disclosure relates to a method of gettering that provides for a high efficiency gettering process by increasing an area in which a getter layer is deposited, and an associated apparatus. In some embodiments, the method is performed by providing a substrate into a processing chamber having one or more residual gases. A cavity is formed within a top surface of the substrate. The cavity has a bottom surface and sidewalls extending from the bottom surface to the top surface. A getter layer, which absorbs the one or more residual gases, is deposited over the substrate at a position extending from the bottom surface of the cavity to a location on the sidewalls. By depositing the getter layer to extend to a location on the sidewalls of the cavity, the area of the substrate that is able to absorb the one or more residual gases is increased.

20 Claims, 6 Drawing Sheets

(56) References Cited

U.S. PATENT DOCUMENTS

| | | |
|---|---|---|
| 8,414,963 B2 | 4/2013 | Baillin |
| 8,485,416 B2 | 7/2013 | Ebefors et al. |
| 8,945,811 B2 | 2/2015 | True |
| 2004/0061207 A1 | 4/2004 | Ding |
| 2011/0012247 A1 | 1/2011 | Wu |
| 2012/0280594 A1 | 11/2012 | Chen et al. |
| 2014/0037869 A1 | 2/2014 | Petrmichl et al. |
| 2014/0175590 A1* | 6/2014 | Gooch ............... H01L 31/0203 257/433 |

OTHER PUBLICATIONS

Non Final Office Action Dated Feb. 23, 2015 U.S. Appl. No. 14/053,751.
Final Office Action Dated Jul. 16, 2015 U.S. Appl. No. 14/053,751.
Notice of Allowance dated Mar. 13, 2017 for U.S. Appl. No. 14/967,663.

* cited by examiner

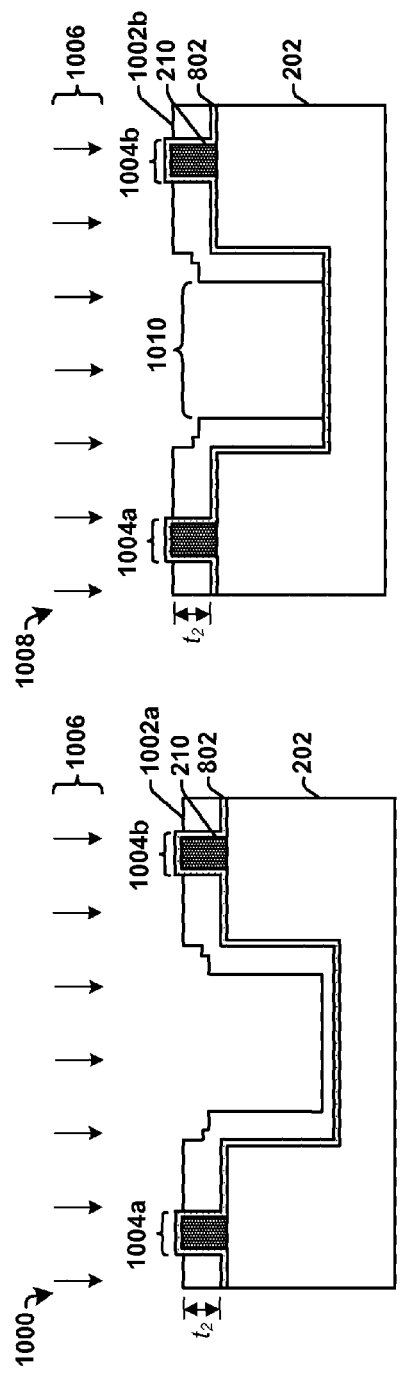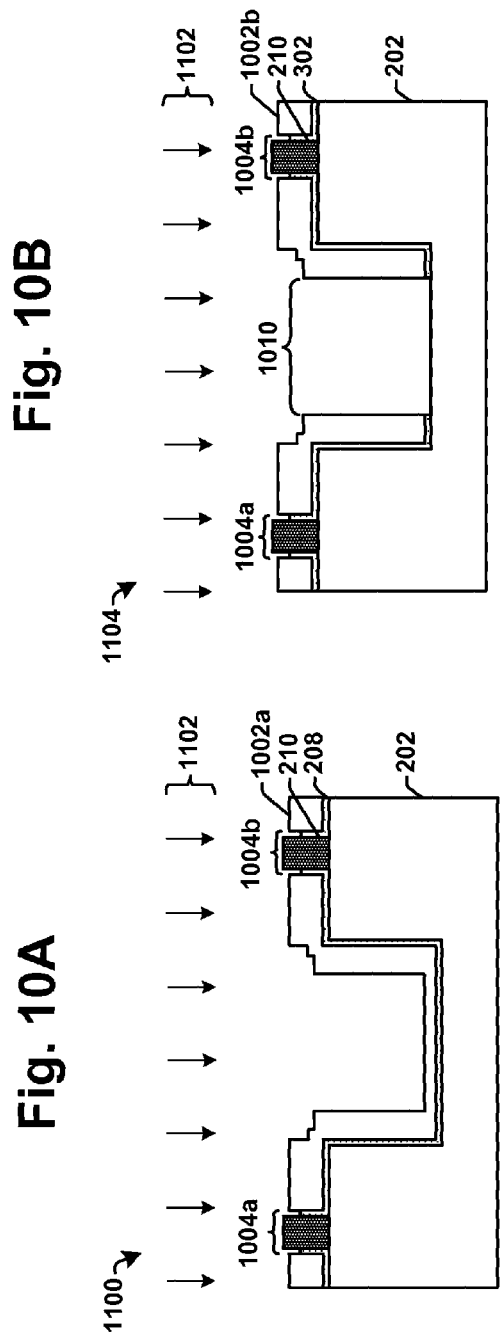

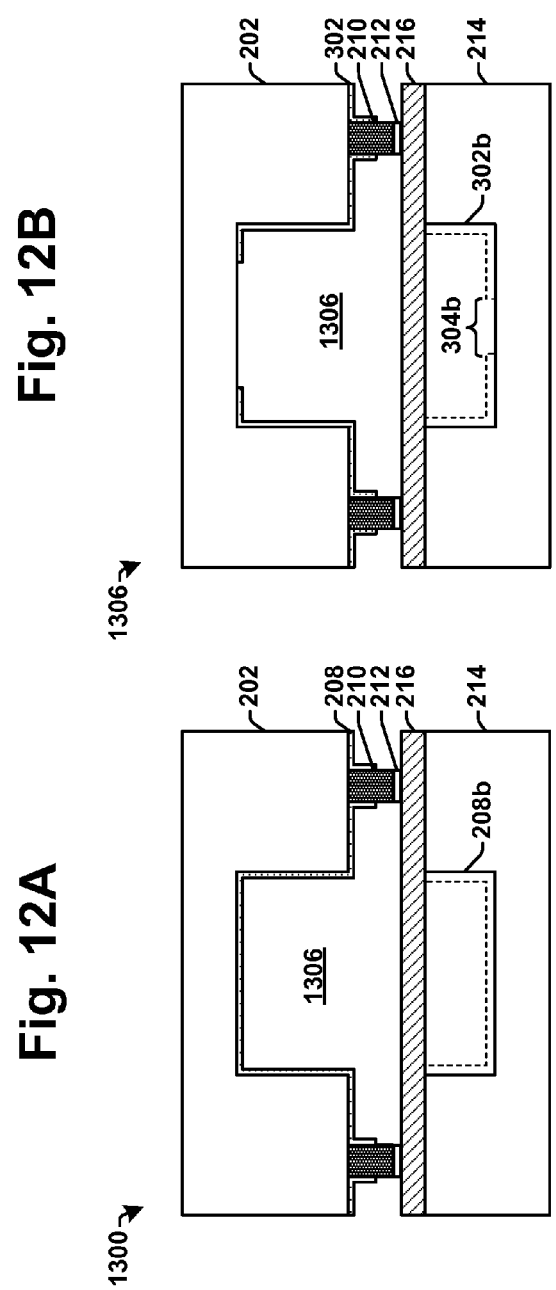

CUP-LIKE GETTER SCHEME

BACKGROUND

Gettering is a process by which unwanted particles are removed (i.e., gettered) from a system. For example, gettering may be used to remove unwanted residual gas molecules from a processing chamber that is under vacuum. By removing the unwanted gas molecules from the chamber, the gettering process reduces a pressure of the vacuum.

Gettering may be performed within a processing chamber by using a vapor deposition technique to deposit a getter layer comprising a plurality of gettering molecules. When a residual gas molecule within the processing chamber comes into contact with a vaporized gettering molecule, the residual gas molecule will combine with the vaporized gettering molecule. The combined gas molecule and gettering molecule are subsequently deposited on the substrate, thereby removing the gas molecule from the vacuum.

BRIEF DESCRIPTION OF THE DRAWINGS

FIGS. 7-13B illustrate cross-sectional views of some embodiments of a substrate upon which a method of gettering is performed.

DETAILED DESCRIPTION

Figure 1:
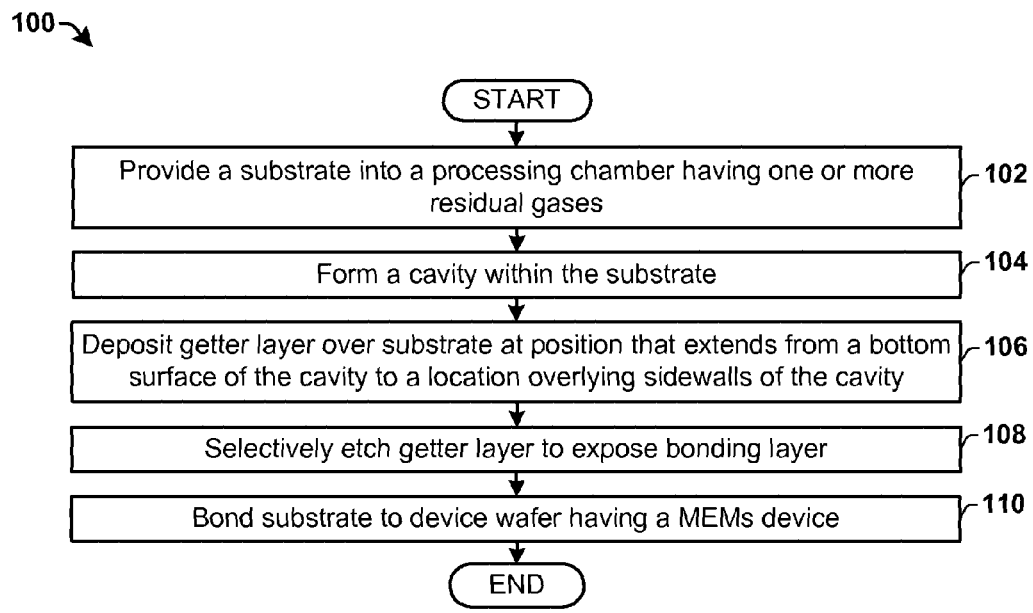
FIG. 1 illustrates a flow diagram of some embodiments of a method of gettering to remove unwanted residual gases from a system.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

MEMs (microelectromechanical system) sensor devices often operate by sensing a characteristic of an environment surrounding the device. For example, to measure an angular momentum, a MEMs vibrational gyroscope may measure a change in an electric field of vibrating particles in proximity to the device. To improve operation of a device, it may be desirable to operate at a specific pressure that enables improved measurement of a desired parameter. For example, in the case of a MEMs vibrational gyroscope, a low pressure vacuum provides for a better measurement since it mitigates background noise.

Therefore, MEMs devices typically have a hermetically-sealed chamber that is held at a controlled pressure level that enables operation of the device. To form the chamber a cap wafer may be eutectically bonded onto a device wafer within a processing chamber. For some MEMs devices, outgassing of residual gases within the processing chamber will increase a pressure within the hermetically-sealed chamber and thereby reduce the sensitivity of an associated MEMs device. To improve a vacuum within the processing chamber, a gettering process may be used to absorb the residual gases. The gettering process deposits a getter layer onto a bottom surface of a cavity within a cap wafer, by way a vapor deposition process, to absorb the residual gases. However, it has been appreciated that if the processing chamber is large, the deposition of a getter layer onto a bottom of the cavity may be unable to absorb enough residual gases to substantially reduce a pressure within the processing chamber.

Accordingly, the present disclosure relates to a method of gettering that provides for a high efficiency gettering process by increasing an area in which a getter layer is deposited, and an associated apparatus. In some embodiments, the method comprises providing a substrate into a processing chamber having one or more residual gases. A cavity is formed within a top surface of the substrate. The cavity comprises a bottom surface and sidewalls extending from the bottom surface to the top surface of the substrate. A getter layer, configured to absorb the one or more residual gases, is deposited over the substrate at a position extending from the bottom surface of the cavity to a location on the sidewalls. By depositing the getter layer to extend to a location on the sidewalls of the cavity, the area of the substrate that is able to absorb the one or more residual gases is increased, thereby increasing an efficiency of the disclosed gettering process.

FIG. 1 illustrates a flow diagram of some embodiments of a method 100 of gettering. The method 100 increases gettering efficiency by providing for a gettering area, configured to receive a getter layer, which extends beyond a bottom surface of a cavity within a cap wafer.

At 102, a substrate is provided into a processing chamber having one or more residual gases. The one or more residual gases comprise gases that remain after a low pressure vacuum has been formed within the processing chamber. The substrate may comprise a semiconductor substrate (e.g., a silicon substrate). In some embodiments, the substrate may comprise a cap wafer configured to form a capping structure of a hermetically sealed chamber in a MEMs (microelectromechanical system) structure. In other embodiments, the substrate may comprise a device wafer (e.g., an ASIC wafer) comprising one or more semiconductor devices.

At 104, a cavity is formed within the substrate. In some embodiments, the cavity is formed at a position located between bonding areas comprising sections of a bonding layer configured to affix the substrate (e.g., a cap wafer) to an additional substrate (e.g., a device wafer having one or more MEMs devices). The cavity comprises a depression in the substrate having sidewalls that extend from a top surface of the substrate to a bottom surface of the cavity.

At 106, a getter layer is deposited onto the substrate at a position that extends from the bottom surface of the cavity to a location overlying the sidewalls. In some embodiments, the getter layer extends from the bottom surface of the cavity to a location overlying the bonding layers disposed on the top surface of the substrate. In such embodiments, the resulting getter layer covers the bottom surface of the cavity, the sidewalls of the cavity, and a part of the top surface of the substrate. By depositing the getter layer to extend along the sidewalls and top surface of the substrate, the gettering area that is configured to receive the getter layer is increased, thereby increasing the surface area of the substrate that is able to absorb the one or more residual gases. In some embodiments, the getter layer may be deposited by way of a vapor deposition technique (e.g., a chemical vapor deposition, a physical vapor deposition, etc.).

At 108, the getter layer may be selectively etched to expose the bonding layer.

At 110, the substrate may be bonded to an additional substrate to form a sealed chamber therebetween. In some embodiments, the substrate may comprise a cap wafer that is bonded to an additional substrate comprising a device wafer having one or more MEMs devices. In other embodiments, the substrate may comprise a device wafer (e.g., an ASIC substrate) that is bonded to an additional wafer comprising a cap wafer. The substrate may be bonded to the additional substrate by way of a eutectic bonding process. In some embodiments, the substrate may be bonded to the additional substrate in-situ within the processing chamber (i.e., without removing the substrate from a processing chamber) so that the bonding occurs at the reduced pressure achieved by the disclosed gettering process.

Figure 2:
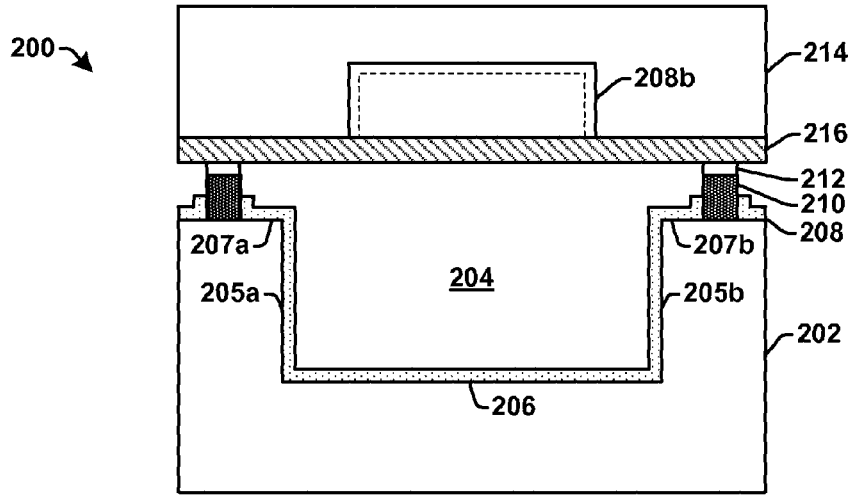
FIG. 2 illustrates a cross-sectional view of some embodiments of a substrate upon which a getter layer has been deposited.

FIG. 2 illustrates some embodiments of a cross-sectional view 200 of a substrate 202 upon which a disclosed getter layer 208 has been deposited.

The substrate 202 comprises a cavity 204 that extends from a top surface 207 of the substrate 202 to a position within the substrate 202. The cavity 204 has interior surfaces comprising a bottom surface 206 and sidewalls 205. In some embodiments, the substrate 202 may comprise a semiconductor material, such as silicon, for example.

A bonding layer 210 is disposed onto the top surface 207 of the substrate 202 at positions adjacent to the cavity 204. In some embodiments, the bonding layer 210 is set back from edges of the cavity 204, so as to provide for a space between the bonding layer 210 and the cavity 204. In some embodiments, the bonding layer 210 may comprise a eutectic bonding layer having a metal such as aluminum or germanium, for example. In other embodiments, the bonding layer 210 may comprise an oxide (for a fusion bonding process), or a metal or a polymer (for a thermal compression bonding process).

A getter layer 208, configured to absorb unwanted residual gases, is disposed over the substrate 202. The getter layer 208 extends from the bottom surface 206 of the cavity onto the sidewalls 205. In some embodiments, the getter layer 208 may be disposed onto the bottom surface 206, the sidewalls 205, and a part of the top surface 207. In such embodiments, the bonding layer 210 is configured to extend through the getter layer 208 from the substrate 202 to a position above the getter layer 208. In various embodiments, the getter layer 208 may comprise barium (Ba), titanium (Ti), zirconium (Zr), hafnium (Hf), vanadium (V), iron (Fe), cobalt (Co), aluminum (Al), and/or silicon (Si), for example.

Since the getter layer 208 is disposed onto the bottom surface 206, the sidewalls 205, and the top surface 207 of the substrate 202, it provides for a large gettering area that is able to absorb residual gases within a processing chamber. Therefore, the getter layer 208 provides for efficient capture of the residual gases.

In some embodiments, the substrate 202 may comprise a cap wafer configured to form a capping structure of a hermetically sealed chamber in a MEMs (microelectromechanical system) structure. In such embodiments, a device wafer 214 having a MEMs device 216 may be disposed onto the bonding layer 210. The bonding layer 210 is configured to affix the device wafer 214 to the substrate 202 (i.e., cap wafer) causing the cavity 204 to form a hermetically sealed chamber abutting the MEMs device 216. In some embodiments, the bonding layer 210 may be bonded to the device wafer 214 at an interface comprising a second bonding layer 212. For example, in a eutectic bonding process, bonding layer 210 may comprise germanium and the second bonding layer 212 may comprise aluminum.

In some embodiments, an additional getter layer 208b may be deposited onto the device wafer 214 (e.g., ASIC wafer) comprising one or more semiconductor devices. Depositing the additional getter layer 208b onto the device wafer 214 reduces pressure within a processing chamber (holding the device wafer) by absorbing residual gases and by reducing outgases from the device wafer 214. This is because the getter layer 208 will cover the one or more semiconductor devices, which may comprise an exposed oxide material and/or an exposed nitride material, which provide for significant outgassing of residual gases. In some embodiments, the getter layer 208b may be deposited onto the device wafer 214 without being deposited onto the substrate 202.

Figure 3:
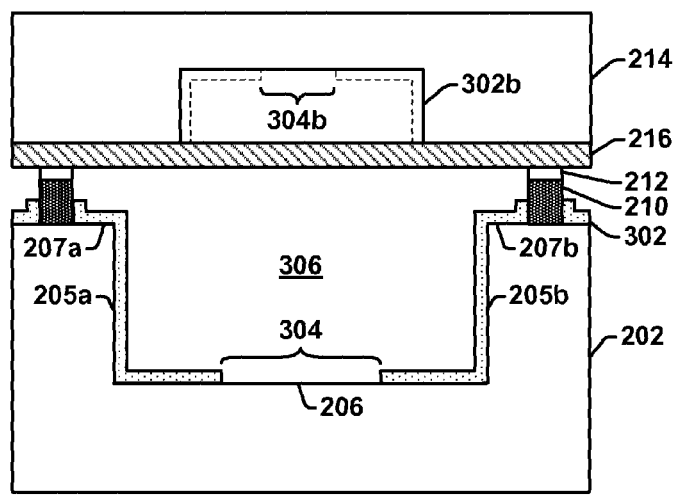
FIG. 3 illustrates a cross-sectional view of some alternative embodiments of a substrate upon which a getter layer has been deposited.

FIG. 3 illustrates some alternative embodiments of a cross-sectional view 300 of a substrate 202 upon which a getter layer 308 has been deposited.

The substrate 202 comprises a cavity 306 as described above. A bonding layer 210 is disposed onto the top surface 207 of the substrate 202 at positions adjacent to the cavity 306. In some embodiments, the bonding layer 210 may comprise a eutectic bonding layer having a metal such as aluminum or germanium, for example. In other embodiments, the bonding layer 210 may comprise an oxide (for a fusion bonding process), or a metal or a polymer (for a thermal compression bonding process).

A getter layer 302, configured to absorb unwanted residual gases, is disposed over the substrate 202. In some embodiments, the getter layer 302 extends from the bottom surface 206 of the cavity to a location abutting the bonding layer 210. The bonding layer 210 is configured to extend through the getter layer 302 from the substrate 202 to a position above the getter layer 208. The getter layer 302 comprises one or more openings 304 that expose the underlying substrate 202 at positions within the cavity 306. It will be appreciated that although the one or more openings 304 are illustrated on the bottom surface 206, the one or more openings 304 may be located at any position within the getter layer 302. For example, in some embodiments, the one or more openings 304 may be positioned along the top surface 207 of the substrate 202 or along the sidewalls 205 of the cavity 306.

In some embodiments, an additional getter layer 302b may be deposited onto the device wafer 214 (e.g., ASIC wafer). The additional getter layer 302b comprises one or more openings 304b that expose the underlying device wafer 214. In some embodiments, the getter layer 302b may be deposited onto the device wafer 214 without being deposited onto the substrate 202.

Figure 4:
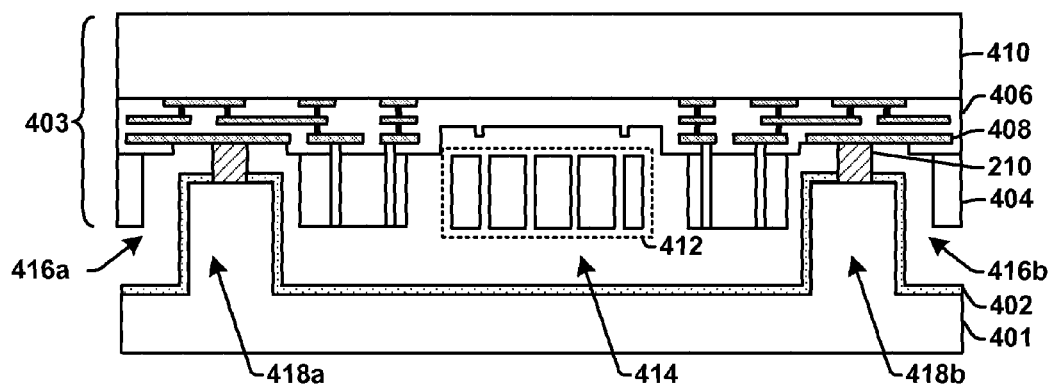
FIG. 4 illustrates a cross-sectional view of some embodiments of a MEMs (microelectromechanical system) device with a socket-type eutectic bond that provides for a chamber having a getter layer.

FIG. 4 illustrates a cross-sectional view of some embodiments of a MEMs (microelectromechanical system) structure 400 with a socket-type eutectic bond that provides for a sealed chamber 414 having a getter layer 402.

The MEMs structure 400 comprises a cap wafer 401 and a device wafer 403. The device wafer 403 comprises a MEMs device having a proof mass 412 located within a chamber 414 (e.g., a hermetically sealed chamber). The proof mass 412 is configured to move within the chamber 414 depending upon a force that operates upon the MEMs structure 400. As the proof mass 412 moves, sensors (not shown) are configured to measure changes in the system caused by the motion and to calculate a desired parameter based upon the measured changes. For example, for a MEMs accelerometer, the proof mass 412 is configured to change position based upon a force of acceleration. As the proof mass 412 moves, a change in capacitance (corresponding to the acceleration) may be measured. In various embodiments, the MEMs device may comprise a MEMs gyroscope, a MEMs accelerometer, or a MEMs pressure sensor, for example.

The device wafer 403 comprises first and second cavities, 416a and 416b, disposed within the device wafer 403. In some embodiments, the device wafer 403 comprises an inter-metal dielectric (IMD) layer 406 disposed onto a MEMs wafer 410. In some embodiments, the MEMs wafer 410 may comprise an ASIC (application specific integrated circuit) substrate. The IMD layer 406 comprises one or more metal interconnect layers 408 configured to electrically couple the MEMs device to one or more logic devices (e.g., CMOS transistors that make the MEMs device function), located within the MEMs wafer 410. In some embodiments, the IMD layer 406 may connect the proof mass 412 to a MEMs wafer 410 comprising one or more stacked wafers (e.g., a 2.5D integrated chip), wherein the one or more stacked wafers comprise one or more logic devices that make the MEMs device function.

In some embodiments, a semiconductor substrate 404 may be disposed onto an opposite side of the IMD layer 406 as the MEMs wafer 410. In such embodiments, the first and second cavities, 416a and 416b, may extend though the semiconductor substrate 404 to expose the IMD layer 406.

The cap wafer 401 comprises first and second standoff structures, 418a and 418b, which extend outward from the substrate 202 as positive reliefs. The first and second standoff structures, 418a and 418b, are disposed at positions corresponding to the first and second cavities, 416a and 416b. The first and second cavities, 416a and 416b, provide an opening for the stand-off structures, 418a and 418b to bond to the IMD layer 406 at an interface comprising a bonding layer 210 configured to affix the cap wafer 401 to the device wafer 403. When the device wafer 403 is brought into contact with the cap wafer 401 the chamber 414 is formed therebetween.

A getter layer 402 is positioned over the cap wafer 401. The getter layer 402 is disposed onto the cap wafer 401 at positions along the sidewalls and the top surface of the standoff structures 418a and 418b. In some embodiments, the getter layer 402 abuts the bonding layer 210, so that the bonding layer 210 extends through the getter layer 402.

Figure 5:
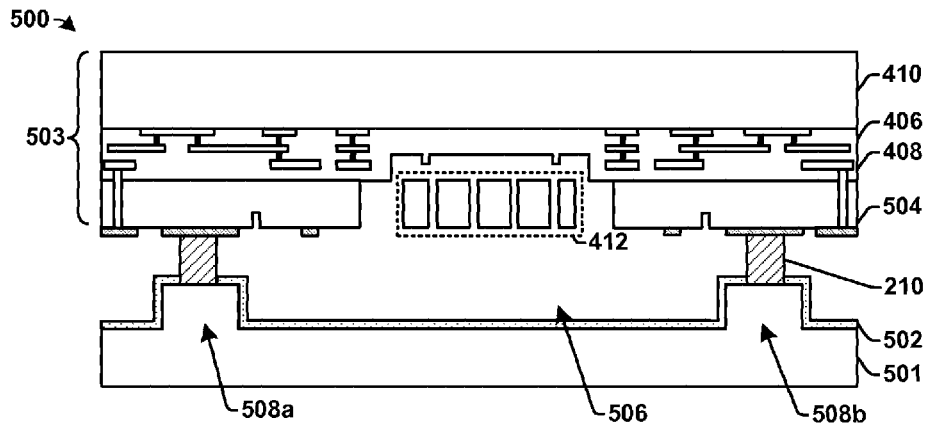
FIG. 5 illustrates a cross-sectional view of some embodiments of a MEMs device with a bond-on-MEMs-type eutectic bond that provides for a chamber having a getter layer.

FIG. 5 illustrates a cross-sectional view of some embodiments of a MEMs (microelectromechanical system) structure 500 with a bond-on-MEMs-type eutectic bond that provides for a sealed chamber having a getter layer 502.

The MEMs structure 500 comprises a cap wafer 501 and a device wafer 503 having a MEMs device. The device wafer 503 comprises a MEMs device having a proof mass 412 located within a chamber 506 (e.g., a hermetically sealed chamber). In some embodiments, the device wafer 503 comprises an inter-metal dielectric (IMD) layer 406 disposed onto a MEMs wafer 410. The IMD layer 406 comprises one or more metal interconnect layer 408 (e.g., copper wires and/or vias) configured to electrically couple the MEMs device to one or more logic devices (e.g., CMOS transistors) within the MEMs wafer 410. In some embodiments, a semiconductor substrate 504 may be disposed onto an opposite side of the IMD layer 406 as the MEMs wafer 410.

The cap wafer 501 comprises first and second standoff structures, 508a and 508b, which extend outward from a rectangular structure of the cap wafer 501 as positive reliefs. A bonding layer 210, configured to affix the device wafer 503 to the cap wafer 501, is disposed onto the first and second standoff structures, 508a and 508b. The bonding layer 210 is configured to contact the device wafer 503 at the semiconductor substrate 504. When the device wafer 503 is brought into contact with the cap wafer 501 the chamber 506 is formed therebetween.

A getter layer 502 is positioned over the cap wafer 501. The getter layer 502 is disposed onto the cap wafer 501 at positions along the sidewalls and the top surface of the standoff structures 508a and 508b. In some embodiments, the getter layer 502 abuts the bonding layer 210, so that the bonding layer 210 extends through the getter layer 502.

Figure 6:
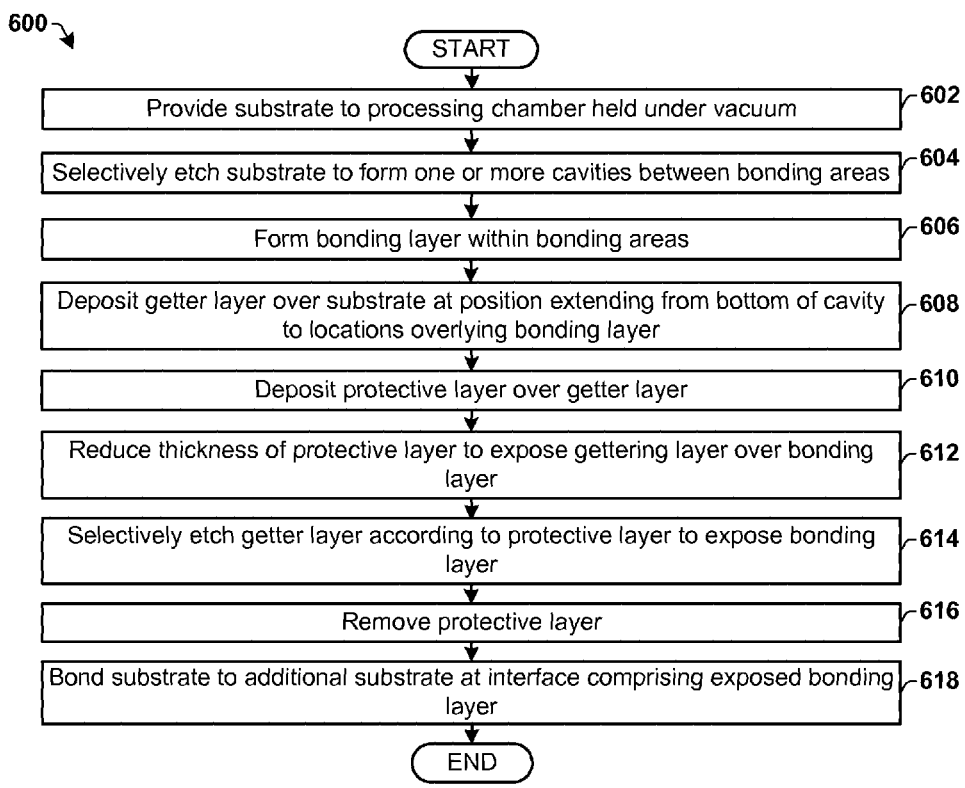
FIG. 6 illustrates a flow diagram of some embodiments of a method of gettering to remove residual gases from a MEMs cavity.

FIG. 6 illustrates a flow diagram of some embodiments of a method 600 of gettering.

While disclosed methods (e.g., methods 100 and 600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a substrate is provided to a processing chamber held under vacuum. In some embodiments, the substrate may comprise a cap wafer configured to operate as a capping structure that forms hermetically sealed chambers for a MEMs (microelectromechanical system) device. In other embodiments, the substrate may comprise a device wafer (e.g., an ASIC substrate) having one or more semiconductor devices.

At 604, one or more cavities are selectively etched in the substrate at positions between bonding areas. In some embodiments, the one or more cavities are selectively formed in the substrate by forming a hard mask over the substrate and then by subsequently etching the substrate according to the hard mask.

At 606, a bonding layer is formed within the bonding areas. In some embodiments, the bonding layer comprises a eutectic metal that is used in a eutectic bonding process. In some embodiments, the eutectic metal may comprise germanium or aluminum.

At 608, a getter layer is deposited over the substrate. The getter layer is deposited over the substrate so as to extend from a bottom surface of the cavities to a position overlying the bonding layer. In some embodiments, the getter layer is deposited onto the bottom and sidewalls of the cavities as well as on the top surface of the substrate.

At 610, a protective layer is deposited over the getter layer. In various embodiments, the protective layer may comprise an oxide or a layer of photoresist material.

At 612, a thickness of the protective layer is reduced to expose the getter layer at positions overlying the bonding layer. In some embodiments, the thickness of the protective layer may be reduced by etching the protective layer using a dry etching process.

At 614, the getter layer is selectively etched to expose the bonding layer. In some embodiments, the getter layer is selectively etched using a wet etching process.

At 616, the protective layer is removed from the substrate. In some embodiments, the protective layer may be removed from the substrate by etching the protective layer using a wet or dry etching process.

At 618, the substrate is bonded to an additional substrate at an interface comprising the bonding layer. In some embodiments, wherein the substrate comprises a cap wafer, the substrate is bonded to a device wafer having one or more MEMs devices and/or semiconductor devices.

FIGS. 7-13B illustrate cross-sectional views of some embodiments of a substrate upon which a method of gettering is performed. Although FIGS. 7-13B are described in relation to method 600, it will be appreciated that the structures disclosed in FIGS. 7-13B are not limited to such a method, but instead may stand alone as a structure.

Figure 7:
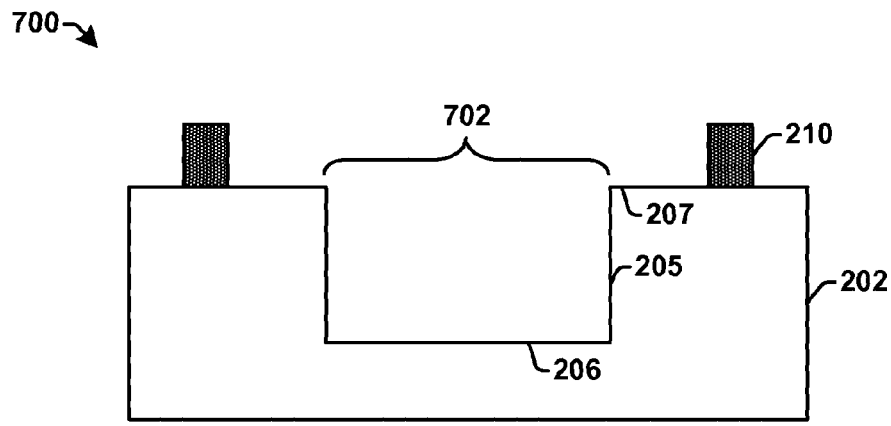

FIG. 7 illustrates some embodiments of a cross-sectional view 700 corresponding to acts 602-604. As shown in cross-sectional view 700, a substrate 202 is provided. The substrate 202 may comprise a semiconductor substrate, such as a silicon substrate for example. A cavity 702 is formed within the substrate 202. The cavity 702 extends from a top surface 207 of the substrate 202 to a position within the substrate 202. The cavity 702 has interior surfaces comprising sidewalls 205 and a bottom surface 206. In some embodiments, the cavity 702 may be formed by selectively etching the substrate 202 according to a hard mask (not shown) configured to define the location of cavity 702 within the substrate 202. In various embodiments, the hard mask may comprise an oxide or a nitride (e.g., SiN), for example.

A bonding layer 210 is formed on the top surface 207 of the substrate 202 within bonding areas. In some embodiments, the bonding layer 210 is set back from edges of the cavity 702, so as to provide for a space between the bonding layer 210 and the cavity 702. In some embodiments, the bonding layer 210 may comprise a eutectic bonding layer having a metal such as aluminum or germanium, for example. In other embodiments, the bonding layer 210 may comprise an oxide (for a fusion bonding process), or a metal or a polymer (for a thermal compression bonding process).

Figure 8:
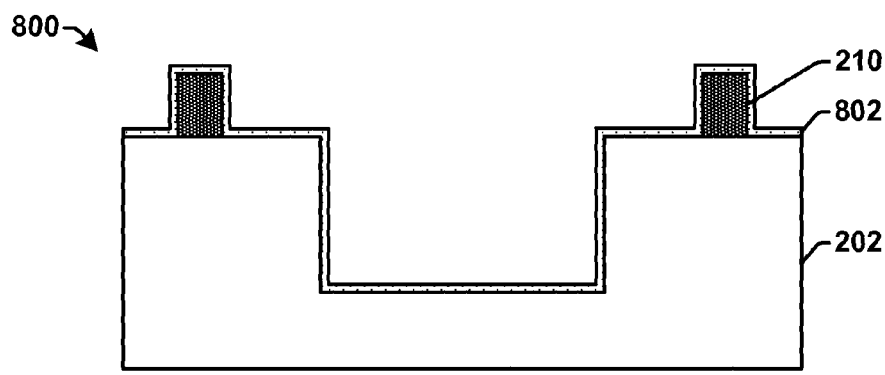

FIG. 8 illustrates some embodiments of a cross-sectional view 800 corresponding to act 606. As shown in cross-sectional view 800, a getter layer 802 is deposited over the substrate 202. The getter layer 802 is deposited over the bottom surface 206 of the cavity 702, the sidewalls 205 of the cavity 702, and the top surface of the substrate 202. In some embodiments, the getter layer 802 may be deposited by a vapor deposition technique, such as a physical vapor deposition or a chemical vapor deposition. In various embodiments, the getter layer 802 may comprise barium (Ba), titanium (Ti), zirconium (Zr), hafnium (Hf), vanadium (V), iron (Fe), cobalt (Co), aluminum (Al), or silicon (Si), for example.

Figure 9:
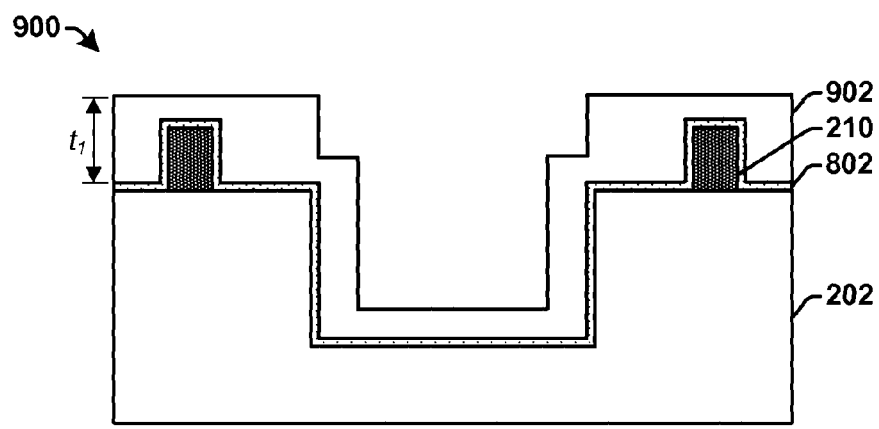

FIG. 9 illustrates some embodiments of a cross-sectional view 900 corresponding to act 608. As shown in cross-sectional view 900, a protective layer 902 is formed over the substrate 202. The protective layer 902 may have a first thickness $t_1$, as illustrated, that is greater than the combined height of the getter layer 802 and the bonding layer 210. In some embodiments, the protective layer 902 is formed onto the getter layer 802. In various embodiments, the protective layer 902 may comprise a photoresist layer deposited by a spin coating process or an oxide layer deposited by a vapor deposition process.

FIGS. 10A-10B illustrates some embodiments of cross-sectional views 1000 and 1008, corresponding to act 610.

As shown in cross-sectional view 1000, the thickness of the protective layer 902 is reduced from the first thickness $t_1$ to a second thickness $t_2$. The second thickness $t_2$ is less than the combined height of the getter layer 802 and the bonding layer 210, thereby resulting in openings, 1004a and 1004b, that exposing the getter layer 802 overlying the bonding layer 210. In some embodiments, the thickness of the protective layer 1002a may be reduced by exposing the protective layer 1002a to an etchant 1006 configured to etch back the protective layer 1002a to form the openings, 1004a and 1004b, that expose the getter layer 802 at positions above the bonding layer 210. In some embodiments, the protective layer 1002a may be selectively etched back using a dry etching process. For example, the dry etching process may use an etch chemistry comprising $C_4F_8$ (octafluorocyclobutane). In other embodiments, the protective layer 1002a may be selectively etched back using a wet etching process (e.g., comprising ammonium fluoride ($NH_4F$) and/or hydrogen fluoride (HF)).

As shown in cross-sectional view 1008, in some embodiments, the protective layer 1002b may be selectively exposed to an etchant 1006 configured to etch back the protective layer 1002b to form additional openings 1010 that expose the getter layer 802 at additional positions. By exposing the getter layer 802 at additional positions, the position of the getter layer 802 can be controlled.

FIGS. 11A-11B illustrates some embodiments of cross-sectional views 1100 and 1104, corresponding to act 612.

As shown in cross-sectional view 1100, the section of the getter layer 208 exposed by openings, 1004a and 1004b, are exposed to an etchant 1102 configured to remove the getter layer 208 from over the bonding layer 210. In some embodiments, the getter layer 208 may be selectively etched using an etchant having a high etching selectivity that removes the exposed getter layer 208 without removing the protective layer 1002. The resulting getter layer 208 surrounds the bonding layer 210, so that the bonding layer 210 extends through the getter layer 208 from the substrate 202 to a position above the getter layer 208.

As shown in cross-sectional view 1104, sections of the getter layer 302 exposed by the additional openings 1010 may also be exposed to an etchant 1102 configured to remove the getter layer 302 at additional positions. By removing the getter layer 302 at additional positions, the position of the getter layer 302 can be controlled.

FIGS. 12A-12B illustrate some embodiments of cross-sectional views 1200 and 1204, corresponding to act 614. As shown in cross-sectional views, 1200 and 1204, the protective layer 1002 is removed. In some embodiments, the protective layer 1002 may be removed using a wet etching process or a dry etching process. For example, a dry etching process comprising an etch chemistry having $C_4F_8$ may be used to remove a protective layer comprising an oxide. Alternatively, a protective layer comprising photoresist may be removed using a dry etching process or a wet etchant (e.g., acetone), for example.

FIGS. 13A-13B illustrate some embodiments of a cross-sectional views, 1300 and 1304, corresponding to act 616. As shown in cross-sectional views, 1300 and 1304, a device wafer 214 (e.g., ASIC substrate) having one or more MEMs devices, 216, may be brought into contact with the substrate 202 at an interface comprising the bonding layer 210. In some embodiments, the bonding layer 210 may be brought into contact with a second bonding layer 212. Bringing the device wafer 214 into contact with the substrate 202 results in the formation of sealed chambers 1306 abutting the one or more MEMs devices 1302.

As shown in cross-sectional view 1300, in some embodiments, the device wafer may comprise a getter layer 204b deposited according to the steps 602-616 of method 600.

As shown in cross-sectional view 1300, in some embodiments, the device wafer may comprise a getter layer 302b deposited according to the steps 602-616 of method 600. Getter layer 302b comprises one or more openings 304b that expose the underlying device wafer 214.

It will be appreciated that while reference is made throughout this document to exemplary structures in discussing aspects of methodologies described herein (e.g., the structure presented in FIGS. 7-13B, while discussing the methodology set forth in FIG. 6), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a method of gettering that provides for a high efficiency gettering process by increasing an area in which a getter layer is deposited, and an associated apparatus In some embodiments, the present disclosure relates to a method of gettering. The method comprises providing a substrate into a processing chamber having one or more residual gases and forming a cavity within a top surface of the substrate, wherein the cavity comprises a bottom surface and sidewalls extending from the bottom surface to the top surface of the substrate. The method further comprises depositing a getter layer, configured to absorb the one or more residual gases, over the substrate at a position extending from the bottom surface of the cavity to a location on the sidewalls.

In other embodiments, the present disclosure relates to a method of forming a getter layer. The method comprises providing a substrate into a processing chamber having one or more residual gases and forming a cavity within a top surface of the substrate. The method further comprises depositing a bonding layer within bonding areas located around the cavity. The method further comprises depositing a getter layer over the substrate at a position extending from a bottom surface of the cavity to a location extending over the bonding layer. The method further comprises depositing a protective layer over the getter layer and reducing a thickness of the protective layer to expose the getter layer at openings overlying the bonding layer. The method further comprises removing the getter layer at the openings, resulting in a bonding layer that extends through the getter layer. The method further comprises removing the protective layer.

In yet other embodiments, the present disclosure relates to a MEMs (microelectromechanical system) device. The MEMs device comprises a substrate comprising a one or more cavities disposed between bonding areas on a top surface of the substrate, wherein the one or more cavities comprise a bottom surface and sidewalls extending from the bottom surface to the top surface of the substrate. The MEMs device further comprises a bonding layer disposed within the bonding areas. The MEMs device further comprises a getter layer onto the substrate at a position extending from the bottom surface to a location overlying the bonding layer.

What is claimed is:

1. A MEMs (microelectromechanical system) structure, comprising:
    a substrate comprising a first cavity having a bottom surface and sidewalls extending from the bottom surface to an upper surface of the substrate;
    one or more bonding structures disposed onto the upper surface of the substrate at locations set back from the first cavity;
    a first getter layer disposed onto the substrate at a position extending from the bottom surface to a location overlying the upper surface of the substrate; and
    a device wafer comprising a MEMs device affixed to the substrate by the one or more bonding structures, wherein the device wafer comprises a second cavity separated from the first cavity by a MEMs substrate,
    a second getter layer disposed onto sidewalls and a horizontal surface of the second cavity.

2. The MEMs structure of claim 1, wherein the first getter layer contacts the bonding structures and has an upper surface that is below an upper surface of the one or more bonding structures.

3. The MEMs structure of claim 1, wherein the first and second getter layers comprise barium (Ba), titanium (Ti), zirconium (Zr), hafnium (Hf), vanadium (V), iron (Fe), cobalt (Co), aluminum (Al), or silicon (Si).

4. The MEMs structure of claim 1,
    wherein an opening extends through the first getter layer to expose a bottom surface of the first cavity; and
    wherein the opening is arranged between horizontal segments of the first getter layer disposed along the bottom surface of the first cavity.

5. A MEMs (microelectromechanical system) structure, comprising:
    a substrate comprising a cavity having a bottom surface and sidewalls extending from the bottom surface to an upper surface of the substrate;
    one or more bonding structures disposed onto the upper surface of the substrate at locations set back from the cavity; and
    a getter layer disposed onto the substrate at a position extending from the bottom surface to a location overlying the upper surface of the substrate, wherein the getter layer contacts the one or more bonding structures and has an upper surface that is below an upper surface of the one or more bonding structures.

6. The MEMs structure of claim 5, further comprising:
a device wafer comprising a MEMs device affixed to the substrate by the one or more bonding structures; and
wherein the device wafer comprises a second cavity separated from the cavity by a MEMs substrate; and
wherein an additional getter layer is located along sidewalls and a horizontal surface of the second cavity.

7. The MEMs structure of claim 5, wherein the getter layer comprises barium (Ba), titanium (Ti), zirconium (Zr), hafnium (Hf), vanadium (V), iron (Fe), cobalt (Co), aluminum (Al), or silicon (Si).

8. The MEMs structure of claim 5, wherein the getter layer has a greater thickness along a sidewall of the one or more bonding structures than laterally between the one or more bonding structures and the cavity.

9. The MEMs structure of claim 5, wherein an opening extends through the getter layer to expose the bottom surface of the cavity.

10. The MEMs structure of claim 9, wherein the opening is arranged between horizontal segments of the getter layer disposed along the bottom surface of the cavity.

11. A MEMs (microelectromechanical system) structure, comprising:
a substrate comprising a cavity disposed between bonding areas on a top surface of the substrate, wherein the cavity comprises a bottom surface and sidewalls extending from the bottom surface to the top surface of the substrate;
a bonding layer disposed within the bonding areas;
a getter layer disposed onto the substrate at a position extending from the bottom surface to a location overlying the top surface of the substrate, wherein the getter layer is arranged along opposing sidewalls of the bonding layer; and
wherein an opening extends through the getter layer to expose the bottom surface of the cavity and wherein the opening is arranged between horizontal segments of the getter layer disposed along the bottom surface of the cavity.

12. The MEMs structure of claim 11, wherein the getter layer comprises barium (Ba), titanium (Ti), zirconium (Zr), hafnium (Hf), vanadium (V), iron (Fe), cobalt (Co), aluminum (Al), or silicon (Si).

13. The MEMs structure of claim 11, wherein the getter layer contacts the opposing sidewalls of the bonding layer.

14. The MEMs structure of claim 11, wherein the getter layer has a greater thickness along a sidewall of the bonding layer than laterally between the bonding layer and the cavity.

15. The MEMs structure of claim 11, wherein the getter layer has an upper surface that is below an upper surface of the bonding layer.

16. The MEMs structure of claim 11, wherein the substrate comprises silicon.

17. The MEMs structure of claim 11, wherein the getter layer is arranged along a first sidewall of the bonding layer facing away from the cavity and along a second sidewall of the bonding layer facing the cavity.

18. The MEMs structure of claim 11, further comprising:
a device wafer comprising a MEMs (microelectromechanical system) device affixed to the substrate at an interface comprising the bonding layer,
wherein a hermetically sealed chamber abutting the MEMs device is disposed between the substrate and device wafer.

19. The MEMs structure of claim 18, wherein the device wafer comprises an ASIC wafer connected to an inter-metal dielectric layer comprising one or more metal interconnect layers.

20. The MEMs structure of claim 18, wherein the device wafer comprises a second cavity separated from the cavity by a MEMs substrate, wherein an additional getter layer is located along sidewalls and a horizontal surface of the second cavity.

* * * * *